US011965919B2

(12) United States Patent
Sun et al.

(10) Patent No.: US 11,965,919 B2
(45) Date of Patent: Apr. 23, 2024

(54) PHASE FREQUENCY DETECTOR-BASED HIGH-PRECISION FEEDBACK FREQUENCY MEASUREMENT APPARATUS AND METHOD

(71) Applicant: Zhejiang University, Zhejiang (CN)

(72) Inventors: Xinglin Sun, Zhejiang (CN); Haojie Wu, Zhejiang (CN); Xinyue Tan, Zhejiang (CN); Lingyun Ye, Zhejiang (CN)

(73) Assignee: Zhejiang University, Zhejiang (CN)

( * ) Notice: Subject to any disclaimer, the term of this patent is extended or adjusted under 35 U.S.C. 154(b) by 150 days.

(21) Appl. No.: 17/816,866

(22) Filed: Aug. 2, 2022

(65) Prior Publication Data

US 2023/0092014 A1   Mar. 23, 2023

(30) Foreign Application Priority Data

Sep. 22, 2021   (CN) .......................... 202111107112.3

(51) Int. Cl.
*G01R 23/10*   (2006.01)
(52) U.S. Cl.
CPC ..................... *G01R 23/10* (2013.01)
(58) Field of Classification Search
CPC ......... G01R 23/10; G06F 1/022; H03L 7/093; H03L 7/0994
See application file for complete search history.

(56) References Cited

U.S. PATENT DOCUMENTS

2016/0365865 A1*   12/2016   Nicholls ................. H03L 1/026
2018/0267159 A1*   9/2018    Wada ..................... G01S 7/4017

* cited by examiner

*Primary Examiner* — Dominic E Hawkins
(74) *Attorney, Agent, or Firm* — WELSH FLAXMAN & GITLER LLC

(57) ABSTRACT

A phase frequency detector-based high-precision feedback frequency measurement apparatus and method: a Field Programmable Gate Array (FGPA) roughly measures a frequency fx of a measured time-frequency pulse by an equal-precision frequency measurement method; a Direct Digital Synthesizer (DDS) automatically synthesizes a frequency fx' according to the fx roughly measured by the FPGA; the fx and the fx' are sent to a phase frequency detector for performing phase frequency detection and then sent to the FPGA after passing through a charge pump, a low-pass filter circuit, and an (Analogue-to-Digital) A/D converter; the FPGA processes a frequency difference obtained by the phase frequency detector and then transmits the processed frequency difference to the DDS to form a negative feedback frequency measurement system so that the DDS continuously adjusts the fx' according to a frequency difference measurement result until the output of the DDS is stable. Therefore, precise measurement of the time-frequency pulse to be measured is realized.

5 Claims, 3 Drawing Sheets

PHASE FREQUENCY DETECTOR-BASED HIGH-PRECISION FEEDBACK FREQUENCY MEASUREMENT APPARATUS AND METHOD

CROSS REFERENCE TO RELATED APPLICATION

This patent application claims the benefit and priority of Chinese Patent Application No. 202111107112.3, filed on Sep. 22, 2021, the disclosure of which is incorporated by reference herein in its entirety as part of the present application.

BACKGROUND OF THE INVENTION

Technical Field

The present disclosure belongs to a frequency signal measurement technology in the technical field of electronic measurement, and particularly, relates to a phase frequency detector-based high-precision feedback frequency measurement apparatus and method.

Background Art

High-precision frequency measurement technology is one of the most basic and important measurement technologies and has a wide application value in a plurality of fields, such as electronic communication, industry, and national defense. With the development of science and technology, the requirement on information transmission and processing is higher and higher, so a frequency measurement technology with higher precision is needed.

Due to rapid development of integrated circuits, an electronic counting method is widely used for its high measurement speed and automatic measurement process. The commonly used frequency measurement methods used at present are direct counting methods, including an M method, a T method, and an M/T method. However, these three methods all have the problem of a counting error of ±1 word. In order to overcome the counting error of ±1 word, other methods, such as a vernier method, a phase coincidence detection method, an analog interpolation method have appeared. The vernier method has the disadvantage that it is difficult to design and the high precision can only be maintained in a short time. The phase coincidence detection method can realize high-precision measurement, but the time for measuring a gate cannot be too short because a phase coincidence point between a measured signal and a reference signal needs to be captured. The analog interpolation method greatly improves the measurement resolution, but it has the disadvantages of long conversion time, poor linearity, and the like. Although these methods above improve the precision of frequency measurement to some extent, they have some limitations in practical use, such as poor measurement stability, gate time uncertainty, and the like.

SUMMARY OF THE INVENTION

An objective of the present disclosure is to provide a phase frequency detector-based high-precision feedback frequency measurement apparatus and method in view of the disadvantages of the existing solution. The present disclosure introduces a phase frequency detector module on the basis of the equal-precision frequency measurement. The frequency measurement precision is improved under the condition of fixed gate time, and measurement data is directly output and is easy to view.

The objective of the present disclosure is achieved through the following technical solutions: a phase frequency detector-based high-precision feedback frequency measurement apparatus includes a reference signal module, a frequency doubling module, a Field Programmable Gate Array (FPGA), a Direct Digital Synthesizer (DDS), a phase frequency detector, and a measured time-frequency signal.

The reference signal module generates a reference signal which is divided into two paths. One path of signal is connected to the FPGA and serves as a clock source for the operation of the FPGA, and the other path of signal is connected to the frequency doubling module. The signal of the reference signal module serves as a clock source Fclk for the operation of the DDS after being subjected to frequency doubling.

The measured time-frequency signal is divided into two paths of signals. One path of signal serves as the initial measured frequency of the FPGA, and the other path of signal is connected to the phase frequency detector and performs phase frequency detection with the frequency signal directly synthesized by the DDS.

The DDS adjusts the output frequency under the control of the FPGA. First, the FPGA roughly measures to obtain a measured signal fx. The DDS synthesizes a reference signal fx' close to the measured signal fx through a frequency control word M according to a roughly measured result thereof. After the phase frequency detector is enabled, the DDS continuously adjusts the output frequency of the DDS until reaching a stable state according to a difference value obtained after phase frequency detection is performed on the measured signal fx and the signal fx' synthesized by the DDS under the control of the FPGA, and the measurement result at this moment is output by the FPGA.

Further, the apparatus further includes a charge pump, a low-pass filter circuit, and an (Analogue-to-Digital) A/D converter. The charge pump receives an output signal of the phase frequency detector to generate a current output signal of a phase difference between the reference signal and the measured signal. The low-pass filter circuit is connected to an output of the charge pump to convert the current signal output by the charge pump into a voltage signal, is connected to the A/D converter to convert an analog signal into a digital signal, and transmits the digital signal to the FPGA. The FPGA outputs a measurement result when a stable state is reached.

Further, the FPGA includes an equal-precision frequency measurement module, a precise frequency measurement module, and a frequency measurement processing module. The equal-precision frequency measurement module receives one path of the signal of the measured time-frequency signal, and roughly measures to obtain a measured signal fx. The precise frequency measurement module, the phase frequency detector, the charge pump, the low-pass filter circuit, the A/D converter, and the DDS form a negative feedback system to adjust the reference signal fx' synthesized by the DDS until reaching a stable state, that is, a precise measurement process is realized within an error range of fx'=fx. The frequency measurement processing module is used for detecting a rough measurement completion signal of the equal-precision frequency measurement module and enabling the precise frequency measurement module.

The present disclosure further provides a phase frequency detector-based high-precision feedback frequency measurement method, including the following steps:

(1) roughly measuring a measured signal fx by an equal-precision frequency measurement method in the FPGA;

(2) determining a reference clock Fclk of the DDS and phase accumulator bit number N according to a result $f_c$ roughly measured in step (1), obtaining a control word M of the DDS through the following formula, directly synthesizing a reference signal fx' according to a frequency control word M by the DDS, and outputting a rough measurement completion signal flag=1;

$$M=(2^N \times f_c)/F_{clk}$$

(3) connecting the measured signal fx and the signal fx' directly synthesized by the DDS obtained in step (2) to the phase frequency detector for performing phase frequency detection;

(4) connecting an output end of the phase frequency detector in step (3) to the charge pump, then converting a frequency and phase difference between two signals into a voltage value after passing through the low-pass filter circuit and the A/D converter, and then transmitting the voltage value to the FPGA;

(5) calculating a frequency difference between the two signals obtained in step (4) according to a relationship between the frequency f and the phase p in the following formula, performing negative feedback adjustment on the control word M of the DDS according to the frequency difference, performing a precise measurement process to output a precisely measured frequency value, and setting the rough measurement completion signal as zero flag=0;

$$p=\int f dt$$

The negative feedback adjustment is that: after the FPGA receives the frequency difference Δf between the measured signal fx and the fx' directly synthesized by the DDS converted and processed by the phase frequency detector, the charge pump, the low-pass filter circuit, and the A/D converter, the frequency difference Δf is converted into a variable quantity ΔM of the control word of the DDS to adjust the fx', and the frequency difference is obtained by continuing comparing the fx' and the measured signal fx by using the phase frequency detector until a stable state is reached, that is, fx'=fx, and the measurement result at this moment is output by the FPGA.

Further, the phase frequency detector in step (3) starts to precisely measure the signal only after the rough measurement is completed.

The present disclosure has the beneficial effects that: the phase frequency detector-based high-precision feedback frequency measurement apparatus and method provided by the present disclosure improve the frequency measurement precision on the basis of equal-precision frequency measurement by using the characteristics that the phase frequency detector is more sensitive to a small phase error and combining the advantages of the high control precision and good system stability of the negative feedback system. In a later stage, the frequency measurement can be completed more quickly by using Proportion Integration Differentiation (PID) control or related control algorithms. A frequency measurement result is directly output in digital quantity, which facilitates data collection and processing.

DETAILED DESCRIPTION OF THE EMBODIMENTS

To make the purpose, technical solutions, and advantages of the embodiments of the present disclosure clearer, the following describes the technical solutions of the embodiments of the present disclosure with reference to the accompanying drawings in the embodiments of the present disclosure. Apparently, the described embodiments are only parts rather than all embodiments of the present disclosure. Based on the embodiments of the present disclosure, all other embodiments obtained by those of skill in the art without creative work shall fall within the scope of protection of the present disclosure.

Figure 1:
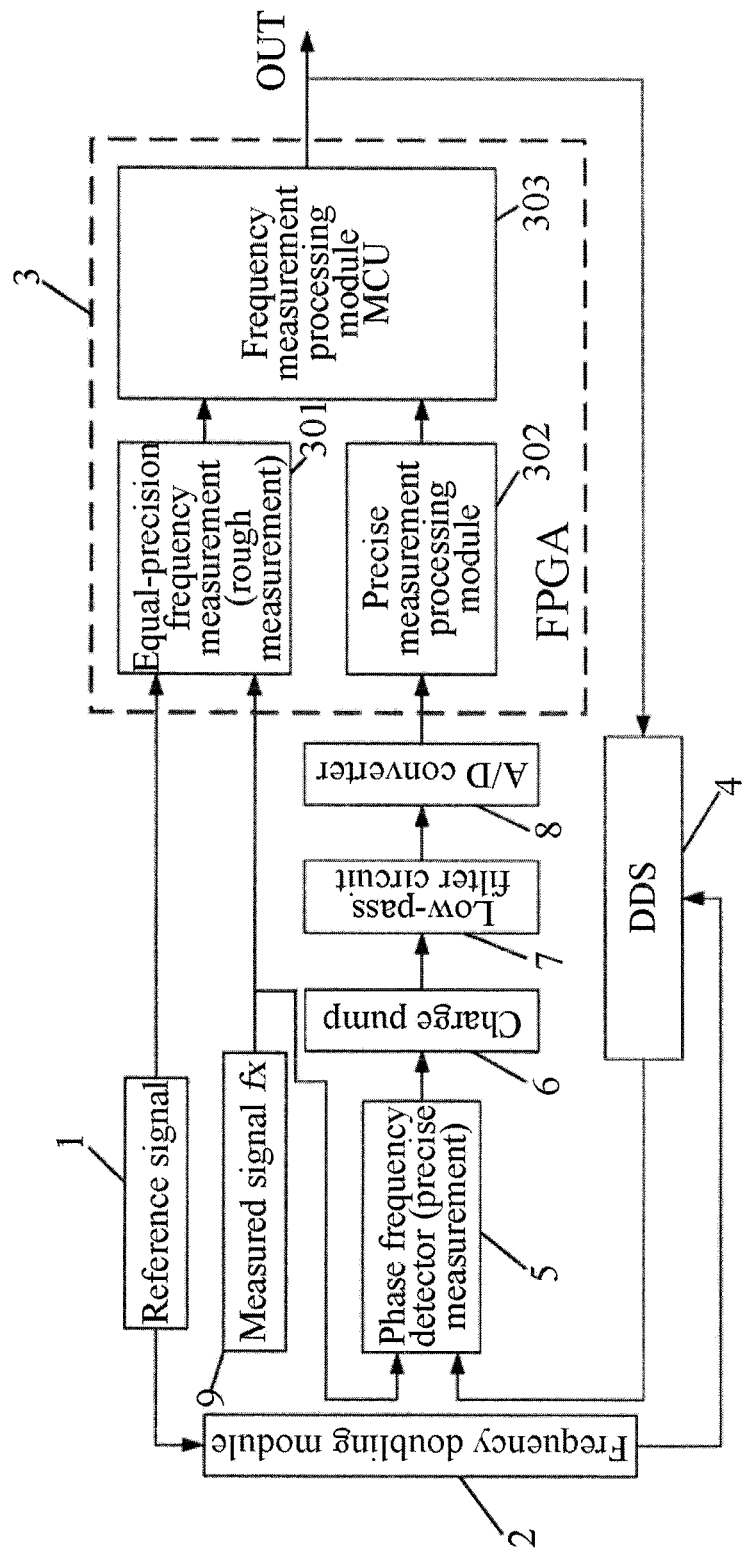
FIG. 1 is a block diagram of a principle of a phase frequency detector-based high-precision feedback frequency measurement method.

As shown in FIG. 1, a phase frequency detector-based high-precision feedback frequency measurement apparatus described in the present disclosure includes a reference signal module 1, a frequency doubling module 2, an FPGA 3, a DDS 4, a phase frequency detector 5, a charge pump 6, a low-pass filter 7, an A/D converter 8, and a measured time-frequency signal 9.

The reference signal module 1 generates a reference signal which is divided into two paths. One path of signal is connected to the FPGA 3 and serves as a clock source for the operation of the FPGA 3, and the other path of signal is connected to the frequency doubling module 2. The reference signal module 1 (a reference source) serves as a clock source Fclk for the operation of the DDS 4 after being subjected to frequency doubling.

The measured time-frequency signal 9 is divided into two paths of signals. One path of signal serves as the initial measured frequency of an equal-precision measurement module 301 and is connected to the FPGA 301, and the other path of signal is connected to the phase frequency detector 5 and performs phase frequency detection with the frequency signal directly synthesized by the DDS 4.

The DDS 4 adjusts the output frequency under the control of the FPGA 3. First, the equal-precision frequency measurement module 301 inside the FPGA 3 roughly measures to obtain a measured signal fx. The DDS 4 synthesizes a reference signal fx' close to the measured signal fx through a frequency control word M according to a roughly measured result thereof. After the phase frequency detector 5 is enabled, the DDS 4 continuously adjusts the output frequency of the DDS 4 until the overall negative feedback frequency measurement system reaches a stable state according to a difference value obtained by performing phase frequency detection on the measured signal fx and the signal fx' synthesized by the DDS 4 under the control of the FPGA 3, that is, fx'=fx, and the measurement result at this moment is output by the FPGA 3.

The charge pump 6 receives an output signal of the phase frequency detector 5 to generate a current output signal of a phase difference between the reference signal and the measured signal. The low-pass filter circuit 7 is connected to an output of the charge pump 6 to convert the current signal output by the charge pump 6 into a voltage signal, is connected to the A/D converter 8 to convert an analog signal into a digital signal, and transmits the digital signal to a precise frequency measurement module 302 in the FPGA 3. The bit number of the A/D converter 8 is 24-bit or 32-bit.

The FPGA 3 is a core processor implemented as the main control logic, parameter storage logic, and a measurement algorithm of the overall system. A logic program inside an FPGA 3 chip is mainly divided into the following parts: the equal-precision measurement module 301, the precise frequency measurement module 302, and a frequency measurement processing module 303. The logic program has the main functions that: when a gate signal is high 1, the input measured signal is roughly measured (by the equal-precision measurement module 301), a DDS is controlled to generate a corresponding frequency signal fx' according to a roughly measured result and a rough measurement completion signal flag=1 is output; the frequency measurement processing module 303 enables the precise frequency measurement module 302 when a gate signal of low 0 and a rough measurement completion signal flag=1 are detected; the precise frequency measurement module 302, the phase frequency detector 5, the charge pump 6, the flow-pass filter 7, the A/D converter 8, and the DDS 4 form a negative feedback system. The control period of the negative feedback system will be configured by the precise frequency measurement module 302. The phase frequency detector 5 is configured as a determination part of the whole negative feedback system. Under the operation of the negative feedback system, the output of the DDS 4 will reach a final stable state.

The present disclosure further provides a phase frequency detector-based high-precision feedback frequency measurement method, including the following specific steps.

Figure 2:
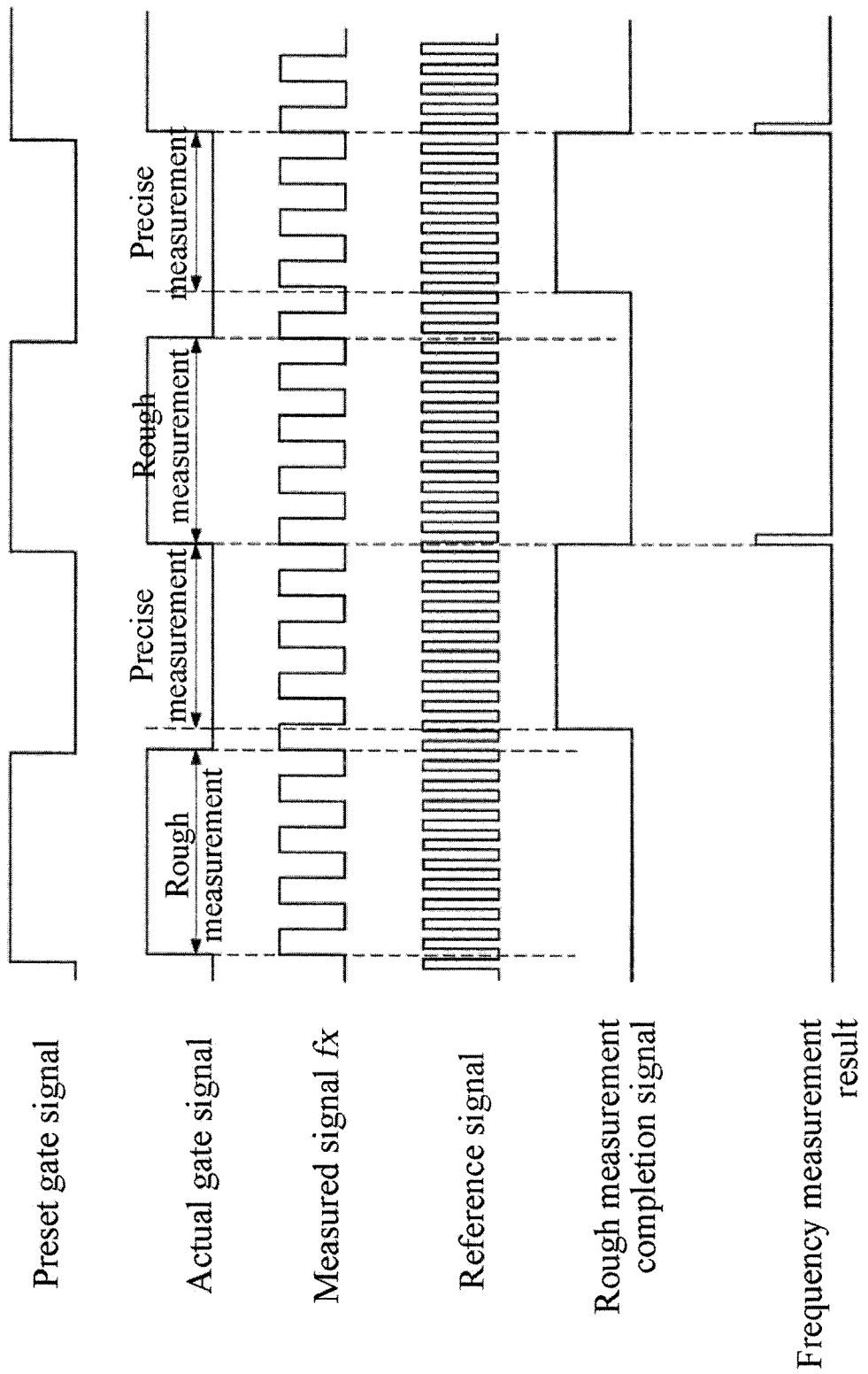
FIG. 2 is a timing diagram of the phase frequency detector-based high-precision feedback frequency measurement method.

(1) The FPGA 3 obtains a gate signal through internal frequency division. When the gate signal is high logic 1, the equal-precision frequency measurement module 301 built internally is enabled to roughly measure the signal divided from the measured time-frequency signal 9 to obtain a measured signal fx. The equal-precision frequency measurement module 301 is used to: count the measured signal 1 and a standard reference fs within a gate time T (fs is obtained by performing frequency doubling on a reference signal by the FPGA by using a Phase Lock Loop (PLL) inside), obtain a count value $N_x$ of the measured signal and the count value $N_s$ of the standard signal, and calculate the roughly measured frequency $f_c$ of the measured signal fx according to the following formula. The actual gate time is the number of full periods of the measured signal. As shown in FIG. 2, ±1 count error of the measured signal is avoided, but the ±1 count error of the standard signal cannot be avoided.

$$f_c = (N_x f_s)/N_s$$

(2) The DDS 4 obtains a control word M of the DDS 4 through the following formula according to a frequency value $f_c$ roughly measured by the FPGA 3, the DDS synthesizes fx' close to fx according to the frequency control word M, and outputs a rough measurement completion signal flag=1.

$$M = (2^N \times f_c)/F_{clk}$$

(3) When receiving the rough measurement completion signal flag=1 and the gate signal is a low logic 0, the phase frequency detector 5 is enabled, the measured signal fx and the fx' directly synthesized by the DDS 4 are connected to the phase frequency detector for performing phase frequency detection. The phase frequency detector 5 starts to precisely measure the signal only after the rough measurement is completed, and is disabled when flag=0 after precise measurement is completed.

(4) An output end of the phase frequency detector 5 in step (3) is connected to the charge pump 6, then a frequency and phase difference between two signals is converted into a voltage value after passing through the low-pass filter circuit 7 and the A/D converter 8, and then the voltage value is transmitted to the precise frequency measurement module 302 in the FPGA 3. The bit number of the A/D converter 8 is 24-bit or 32-bit.

(5) A frequency difference between the two signals obtained in step (4) is calculated according to a relationship between the frequency f and the phase p in the following formula, negative feedback adjustment is performed on the control word M of the DDS according to the frequency difference until the precise measurement is completed, a precisely measured frequency value is output, and the rough measurement completion signal is set as zero flag=0.

$$p = \int f dt$$

The negative feedback adjustment includes proportional adjustment, differential adjustment, and integral adjustment.

The negative feedback adjustment is that: after the FPGA 3 receives the frequency difference Δf between the measured signal fx and the fx' directly synthesized by the DDS 4 converted and processed by the phase frequency detector 5, the charge pump 6, the low-pass filter circuit 7, and the A/D converter 8, the frequency difference Δf is converted into a variable quantity ΔM of the control word of the DDS 4 to adjust the fx', and the frequency difference is obtained by continuing comparing the fx' and the measured signal fx by using the phase frequency detector 5 until the overall negative feedback system is stable.

EMBODIMENT

The present disclosure mainly aims to improve the precision of frequency measurement. The time-frequency signal measured in the embodiment is a square wave signal with the frequency of 9998.55 Hz, and the duty cycle of 50%.

In the embodiment, the precision of the measured time-frequency signal fx needs to be higher than the frequency measurement precision of a phase frequency detector-based high-precision feedback frequency measurement system, so as to ensure that the measurement result can correctly reflect the precision of the measurement system of the present disclosure.

In the embodiment, when the gate signal is a high logic 1, the FPGA 3 enables the equal-precision frequency measurement module 301 built internally to roughly measure the measured signal fx. The actual gate time is the number of full periods of the measured signal fx. The measured signal fx and the standard signal fs are counted within a gate time T, so as to obtain a count value Nx of the measured time-frequency signal and the count value Ns of the standard time-frequency signal. The roughly measured frequency f of the measured time-frequency signal fx is calculated according to the formula $$f = \frac{N_x}{N_s} f_s$$

The roughly measured frequency f in the present embodiment is between 9997.5501 Hz and 9999.5499 Hz.

In the embodiment, the DDS 4 obtains the control word M of the DDS 4 through $M=(2^N \times f_x)/F_{clk}$ according to the frequency value f roughly measured by FPGA 3, and the DDS 4 synthesizes fx' with the frequency close to that of fx according to the frequency control word M, and outputs a rough measurement completion signal flag=1. In the present embodiment, the operation clock source Fclk of the DDS 4 is 64 KHz, the phase accumulator of the DDS 4 is 26-bit, and the roughly measured M is between 10484187 and 10484292.

In the embodiment, analog-to-digital conversion needs to be performed after a phase frequency detection result is collected. An analog quantity is converted into a digital quantity by using the A/D converter 8, and the digital quantity is transmitted to the FPGA 3. The conversion bit number of the A/D converter 8 should ensure that a micro-voltage signal in an original signal can be effectively digitalized and the voltage signal cannot overflow. The bit number of the A/D converter 8 in the present embodiment is 32-bit.

In the embodiment, after a precisely measured result is digitalized, then the adjustment amount ΔM of the control word of the DDS needs to be determined. The value of ΔM may be determined according to the value of a frequency variable quantity obtained by comparing the frequency of the current time and the frequency of the previous time. The variable quantity of the ΔM after the system is stable determines the precision of the overall negative feedback frequency measurement system. In the embodiment, ΔM=Mdf.

In the embodiment, after the adjustment quantity of the control word of the DDS 4 is determined, then the result calculated by the FPGA 3 needs to be subjected to an interception operation. In previous steps, the control word of the DDS can only be an integer. A specific method is to round the obtained control word.

Negative feedback adjustment is performed on the control word M of the DDS according to a frequency difference between the two signals until the precise measurement is completed, and a precisely measured frequency value is output and a rough measurement completion signal is set as zero flag=0.

Figure 3:
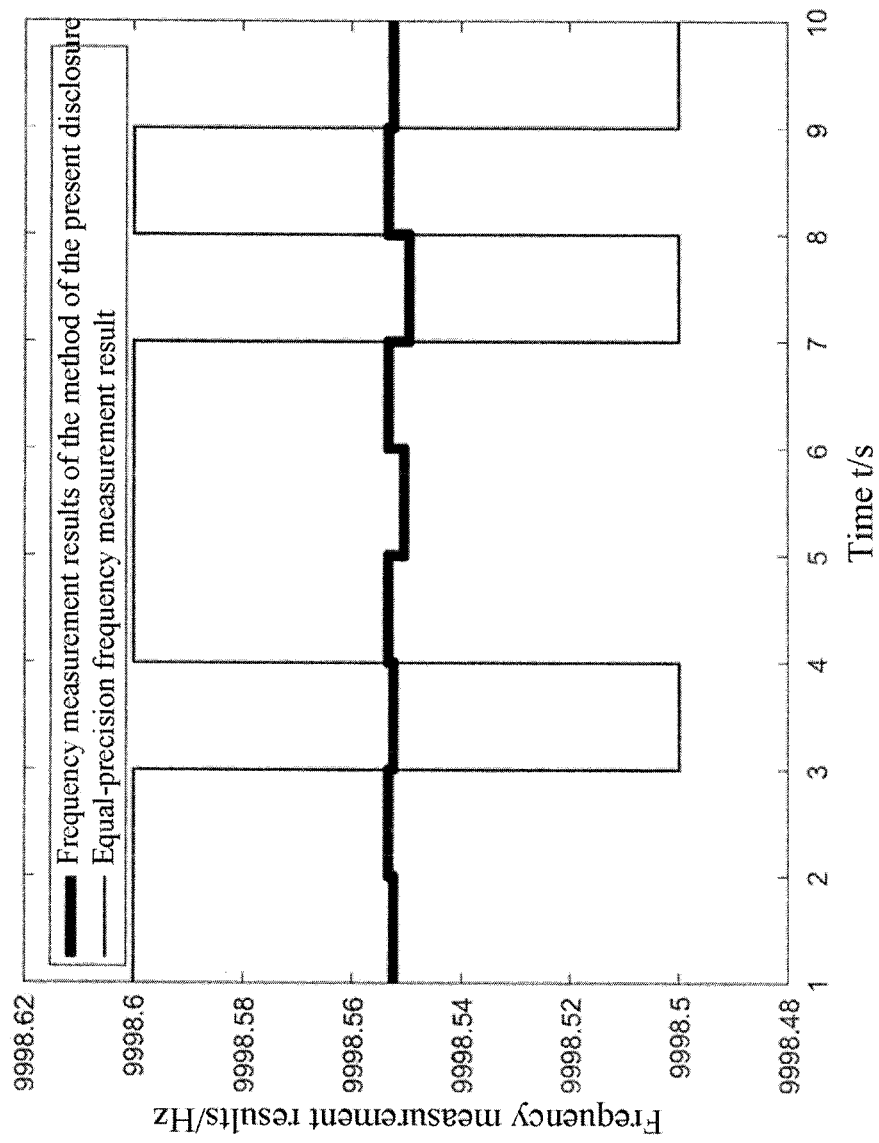
FIG. 3 is a measurement result diagram of an embodiment of the present disclosure.

In the embodiment, after the precise measurement is completed, a frequency measurement result of the phase frequency detector-based high-precision feedback frequency measurement system is output, and the rough measurement completion signal is set as 0, flag=0, as shown in FIG. 2. In the present embodiment, the output control word M of the frequency measurement result of the measured time-frequency signal is between 10484235 and 10484245. After conversion, the precise measurement frequency is 9998.5456 Hz to 9998.5553 Hz, and the measurement result is as shown in FIG. 3.

Compared the equal-precision frequency measurement result with the high-precision feedback frequency measurement result based on the phase frequency detector, the present disclosure introduces the phase frequency detector module on the basis of equal-precision frequency measurement, a feedback frequency measurement system is built, and the frequency measurement precision is improved by 5-10 times.

The contents not described in detail in the specification of the present disclosure belong to the prior art known to those skilled in the art The abovementioned embodiments are intended to explain the present disclosure rather than limiting the present disclosure. Any modifications and changes made to the present disclosure within the scope of protection of the spirit and claims of the present disclosure fall within the scope of protection of the present disclosure.

What is claimed is:

1. A phase frequency detector-based high-precision feedback frequency measurement apparatus, comprising a reference signal module (1), a frequency doubling module (2), a Field Programmable Gate Array (FPGA) (3), a Direct Digital Synthesizer (DDS) (4), a phase frequency detector (5), and a measured time-frequency signal (9), wherein the reference signal module (1) generates a reference signal which is divided into two paths; one path of signal is connected to the FPGA (3) and serves as a clock source for the operation of the FPGA (3); the other path of signal is connected to the frequency doubling module (2); the signal of the reference signal module (1) serves as a clock source Fclk for the operation of the DDS (4) after being subjected to frequency doubling;

the measured time-frequency signal (9) is divided into two paths of signals; one path of signal serves as the initial measured frequency of the FPGA (3), and the other path of signal is connected to the phase frequency detector (5), and performs phase frequency detection with the frequency signal directly synthesized by the DDS (4);

the DDS (4) adjusts the output frequency under the control of the FPGA (3); first, the FPGA (3) roughly measures to obtain a measured signal fx; the DDS (4) synthesizes a reference signal fx' close to the measured signal fx through a frequency control word M according to a roughly measured result thereof; and after the phase frequency detector (5) is enabled, the DDS (4) continuously adjusts the output frequency of the DDS (4) until reaching a stable state according to a difference value obtained by performing phase frequency detection on the measured signal fx and the signal fx' synthesized by the DDS (4) under the control of the FPGA (3), and the measurement result at this moment is output by the FPGA (3).

2. The phase frequency detector-based high-precision feedback frequency measurement apparatus according to claim 1, further comprising a charge pump (6), a low-pass filter circuit (7), and an (Analogue-to-Digital) A/D converter (8), wherein the charge pump (6) receives an output signal of the phase frequency detector (5) to generate a current output signal of a phase difference between the reference signal and the measured signal; the low-pass filter circuit (7) is connected to an output of the charge pump (6) to convert the current signal output by the charge pump (6) into a voltage signal, is connected to the A/D converter (8) to convert an analog signal into a digital signal, and transmits the digital signal to the FPGA (3); and the FPGA (3) outputs a measurement result when a stable state is reached.

3. The phase frequency detector-based high-precision feedback frequency measurement apparatus according to claim 2, wherein the FPGA (3) comprises an equal-precision frequency measurement module (301), a precise frequency measurement module (302), and a frequency measurement processing module (303); the equal-precision frequency measurement module (301) receives one path of signal of the measured time-frequency signal (9), and roughly measures to obtain a measured signal fx; the precise frequency measurement module (302), the phase frequency detector (5), the charge pump (6), the low-pass filter circuit (7), the A/D converter (8), and the DDS (4) form a negative feedback system to adjust the reference signal fx' synthesized by the DDS (4) until reaching a stable state, that is, a precise measurement process is realized within an error range of fx'=fx; and the frequency measurement processing module (303) is used for detecting a rough measurement completion signal of the equal-precision frequency measurement module (301), and enabling the precise frequency measurement module (302).

4. A phase frequency detector-based high-precision feedback frequency measurement method, comprising the following steps:
- (1) roughly measuring a measured signal fx by an equal-precision frequency measurement method in the FPGA (3);
- (2) determining a reference clock Fclk of the DDS (4) and phase accumulator bit number N according to a result $f_c$ roughly measured in step (1), obtaining a control word M of the DDS (4) through the following formula, directly synthesizing a reference signal fx' according to a frequency control word M by the DDS (4), and outputting a rough measurement completion signal flag=1;

$$M=(2^N \times f_c)/F_{clk}$$

- (3) connecting the measured signal fx and the signal fx' directly synthesized by the DDS (4) obtained in step (2) to the phase frequency detector (5) for performing phase frequency detection;
- (4) connecting an output end of the phase frequency detector (5) in step (3) to the charge pump (6), then converting a frequency and phase difference between two signals into a voltage value after passing through the low-pass filter circuit (7) and the A/D converter (8), and then transmitting the voltage value to the FPGA (3);
- (5) calculating a frequency difference between the two signals obtained in step (4) according to a relationship between the frequency f and the phase p in the following formula, performing negative feedback adjustment on the control word M of the DDS (4) according to the frequency difference, performing a precise measurement process to output a precisely measured frequency value, and setting the rough measurement completion signal as zero flag=0;

$$p=\int f dt$$

wherein the negative feedback adjustment is that: after the FPGA (3) receives the frequency difference Δf between the measured signal fx and the fx' directly synthesized by the DDS (4) converted and processed by the phase frequency detector (5), the charge pump (6), the low-pass filter circuit (7), and the A/D converter (8), converting the frequency difference Δf into a variable quantity ΔM of the control word of the DDS (4) to adjust the fx', and continuing to compare the frequency difference between the fx' and the measured signal fx by using the phase frequency detector (5) until reaching a stable state, that is, fx'=fx, and outputting the measurement result at this moment by the FPGA (3).

5. The phase frequency detector-based high-precision feedback frequency measurement method according to claim 4, wherein the phase frequency detector (5) in step (3) starts to precisely measure the signal only after the rough measurement is completed.

* * * * *